(12) United States Patent
Kim et al.

(10) Patent No.: US 8,142,111 B2
(45) Date of Patent: Mar. 27, 2012

(54) SUPPORT PLATFORM OF NON-CONTACT TRANSFER APPARATUS

(75) Inventors: Sung Eun Kim, Woolsan-si (KR); Hyun Joo Jeon, Daegu-si (KR); Hwan Kyu Yoo, Osan-si (KR); Ji Young Oh, Seoguipo-si (KR); Tae Kyun Kwon, Changwon-si (KR)

(73) Assignees: LG Display Co., Ltd., Seoul (KR); Avaco Co., Ltd., Daegu-si (KR); LG Electronics, Inc., Seoul (KR)

( * ) Notice: Subject to any disclaimer, the term of this patent is extended or adjusted under 35 U.S.C. 154(b) by 0 days.

(21) Appl. No.: 13/053,861

(22) Filed: Mar. 22, 2011

(65) Prior Publication Data
US 2011/0164930 A1 Jul. 7, 2011

Related U.S. Application Data

(62) Division of application No. 11/455,930, filed on Jun. 20, 2006, now Pat. No. 7,927,045.

(30) Foreign Application Priority Data

Jun. 20, 2005 (KR) .......................... 10-2005-0052914

(51) Int. Cl.
*B65G 53/00* (2006.01)
(52) U.S. Cl. ........................................... 406/88; 406/86

(58) Field of Classification Search .................... 406/86, 406/88; 414/676
See application file for complete search history.

(56) References Cited

U.S. PATENT DOCUMENTS

| | | | |
|---|---|---|---|
| 3,385,490 A | 5/1968 | Malmgren et al. | |
| 3,395,943 A | 8/1968 | Wilde et al. | |
| 4,021,078 A | 5/1977 | Hutar et al. | |
| 4,474,320 A | 10/1984 | Rueger et al. | |
| 4,874,273 A | 10/1989 | Tokisue | |
| 5,078,775 A | 1/1992 | Maltby et al. | |
| 5,209,387 A | 5/1993 | Long et al. | |
| 6,285,102 B1 | 9/2001 | Matsuoka et al. | |
| 6,676,365 B2 * | 1/2004 | Adam et al. | 406/83 |
| 6,781,684 B1 | 8/2004 | Ekhoff et al. | |
| 6,805,318 B2 | 10/2004 | Ebner | |
| 6,808,358 B1 | 10/2004 | Mayerberg et al. | |
| 2003/0177790 A1 | 9/2003 | Langsdorf et al. | |
| 2006/0054774 A1 | 3/2006 | Yassour et al. | |

\* cited by examiner

*Primary Examiner* — Gene Crawford
*Assistant Examiner* — William R Harp
(74) *Attorney, Agent, or Firm* — McKenna Long & Aldridge, LLP

(57) ABSTRACT

Provided is a support platform of a non-contact transfer apparatus. The support platform is arranged horizontally and includes first and second members adding a lift force to a first force for lifting peripheral portions of a transferred object, wherein the first force is lower than a second force lifting a central portion of the transferred object.

5 Claims, 8 Drawing Sheets

SUPPORT PLATFORM OF NON-CONTACT TRANSFER APPARATUS

CROSS-REFERENCE TO RELATED APPLICATIONS

This application is a Divisional of application Ser. No. 11/455,930 filed Jun. 20, 2006 now U.S. Pat. No. 7,927,045, now allowed, which claims priority to Korean Patent Application No. 10-2005-0052914, filed Jun. 20, 2005, all of which are hereby incorporated by reference for all purposes as if fully set forth herein.

BACKGROUND OF THE INVENTION

1. Field of the Invention

The present invention relates to a support platform of a non-contact transfer apparatus, and more particularly, to a support platform that can transfer objects under a non-contact state.

2. Description of the Related Art

Generally, in order to manufacture a semiconductor integrated circuit or a display panel, an object (for example, a substrate) undergoes a plurality of processes.

In order to transfer the object from one process to another process, a transfer apparatus is used. A transfer apparatus that can efficiently transfer the object has been researched.

Transfer apparatuses are classified into contact transfer apparatuses that can transfer the object in a state where the object directly contacts a support platform and non-contact transfer apparatuses that can transfer the object in a state where the object is lifted by air pressure.

In the case of the contact transfer apparatus, since the object is transferred in a state where it contacts the support platform, the object may be scratched due to the friction between the object and the support platform or broken. In the case of the non-contact transfer apparatus, because the object is transferred without contacting the support platform, damage to the object can be minimized or prevented and pollution of the object by foreign objects can be lowered. Furthermore, there is no electrostatic problem caused by contact between the object and the support platform.

Recently, the non-contact transfer apparatus has been more actively studied.

FIG. 1 shows a support platform of a non-contact transfer apparatus according to the related art of the present invention.

Referring to FIG. 1, a related art support platform 100 of a non-contact transfer apparatus includes a plurality of unit cells each having a chess-table format. The unit cells are provided with a plurality of air intake hole portions 101 and a plurality of air exhaust holes 102. The air is sprayed toward an object 106 through the air intake hole portions 101 and is then exhausted to an external side through the air exhaust holes 102. Air is sprayed toward an object 106 through the air intake hole portions 101 and is then exhausted to an external side through the air exhaust holes 102.

When the object 106 that may have a size equal to, greater or less than that of an active surface 107 of the platform 100 is arranged close to the active surface 107 in parallel, an air cushion 104 is formed between a bottom surface of the object 106 and the active surface 107. The air cushion 104 provides a pressure for uniformly lifting the object 106. The intensity of the pressure depends on an amount of air introduced through the air intake hole portions 101 and an amount of air exhausted through the air exhaust holes 102.

The object 106 may be transferred in the arrow direction in FIG. 1.

The air intake hole portions 101 are connected to a pressure storing unit 108 connected to an air pump 109. Therefore, the air taken in the air pump 109 is stored in the pressure storing unit 108 and is then relaxed through the air intake hole portions 101. The released air forms the air cushion 104 to transfer the object in a state where the object 106 is lifted from the active surface 107 of the platform 100 by a predetermined interval.

In the non-contact transfer apparatus of the related art, since each air intake hole 101 through which the air is introduced has a predetermined diameter, a large amount of air is consumed to form the air cushion 104 on the active surface 107, thereby increasing the process costs.

In addition, since not only the pitches between the holes 101 and 102 but also the diameters of the holes 101 and 102 are identical to each other, the pressure at a central portion of the support platform is greater than that at the peripheral portion of the support platform. That is, the pressure distribution is not uniform throughout the active surface of the support platform. Therefore, the object lifted from the platform may jolt or collide with a periphery of the object. This causes damage to the object.

SUMMARY OF THE INVENTION

Accordingly, the present invention is directed to a support platform of a non-contact transfer apparatus that substantially obviates one or more problems due to limitations and disadvantages of the related art.

An advantage of the present invention is to provide a support platform of a non-contact transfer apparatus that can dramatically reduce the consumption of air.

Another advantage of the present invention is to provide a support platform of a non-contact transfer apparatus that can stably transfer an object.

Additional advantages and features of the invention will be set forth in part in the description which follows, and in part will be apparent from the description or may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a support platform of a non-contact transfer apparatus, the support platform being arranged horizontally and including: first and second members adding a lift force to a first force for lifting peripheral portions of a transferred object, wherein the first force is lower than a second force lifting a central portion of the transferred object.

In another aspect of the present invention, there is provided a support platform of a non-contact transfer apparatus, wherein the support platform is arranged horizontally and has a substantially rounded shape that protrudes downward such that a relatively high air pressure can be applied to peripheral portions of a transferred object and a relatively low air pressure can be applied to a central portion of the transferred object.

In another aspect of the present invention, there is provided a support platform of a non-contact transfer apparatus, the support platform being erected on a horizontal surface at a predetermined angle with respect to the horizontal surface and including: a member adding a lift force to a first force for lifting an upper peripheral portion of a transferred object, wherein the first force is lower than a second force for lifting a central portion of the transferred object.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
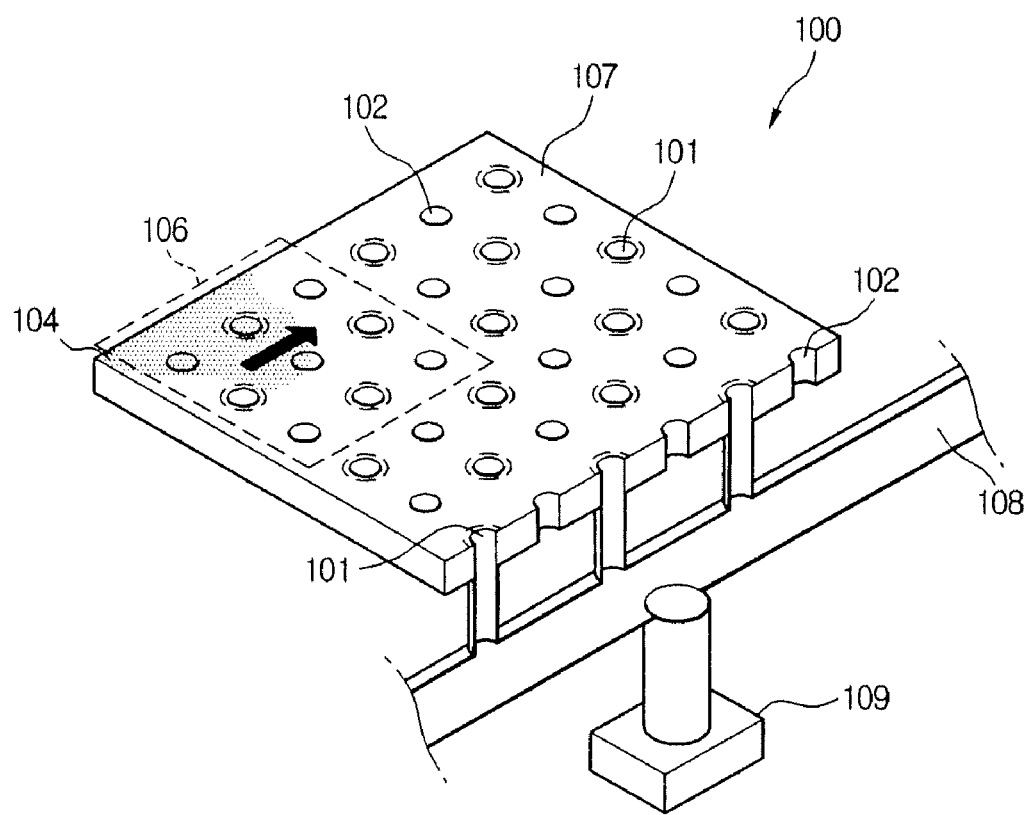
FIG. 1 is a schematic perspective view of a support platform of a non-contact transfer apparatus according to the related art.
Figure 2A:
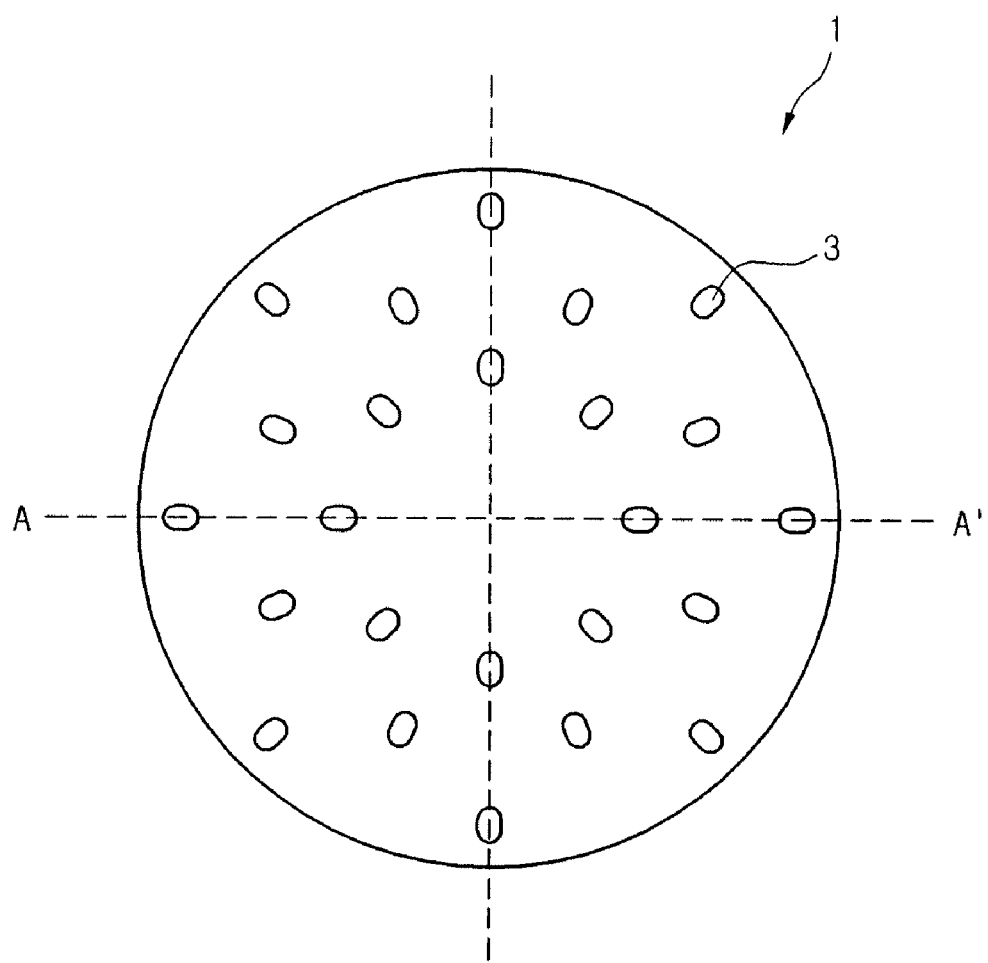
FIG. 2A is a top view illustrating an air intake hole portion of a support platform of a non-contact transfer apparatus of the present invention.
Figure 2B:
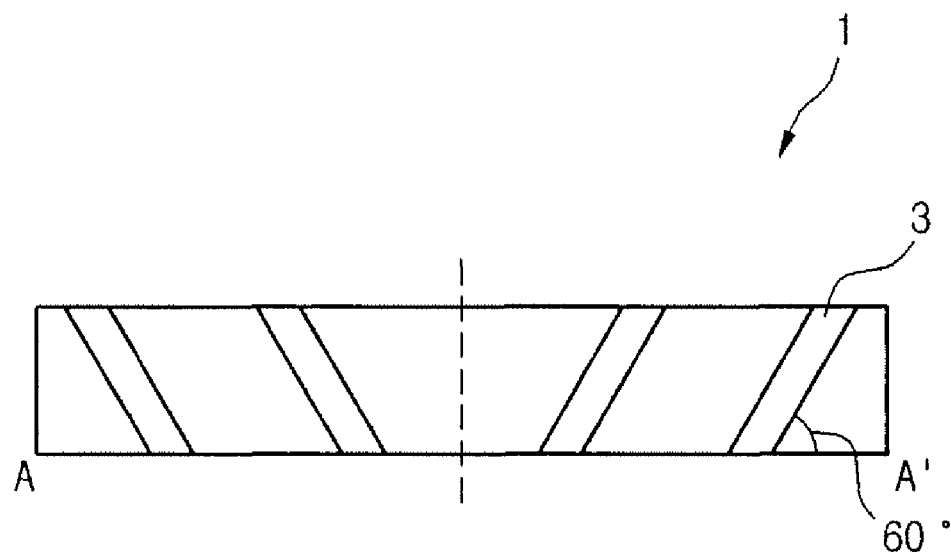
FIG. 2B is a sectional view taken along line A-A' of FIG. 2A.

FIGS. 2A and 2B are respective top and sectional views illustrating an air intake hole portion of a support platform of a non-contact transfer apparatus of the present invention.

Referring first to FIG. 2A, an air intake hole portion 1 of a support platform includes a plurality of sub-holes 3. The number and locations of the sub-holes 3 formed on a left or lower half of the air intake hole portion 1 are identical to those of the sub-holes 3 formed on a right or upper half of the air intake hole portion 1. That is, the sub-holes 3 are symmetrically formed with reference to a centerline of the air intake hole portion 1. Air is introduced upward through the sub-holes 3. The sub-holes 3 may be formed in a rectangular shape, an oval shape, a circular shape, or a polygonal shape.

Referring to FIG. 2B, the sub-holes 3 are inclined at a predetermined angle relative to a bottom surface of the support platform. The inclination of the sub-hole 3 may vary according to a size, shape and weight of an object that will be transferred. For example, the sub-hole 3 may be inclined at about 50-70°, preferably 60°, to the surface of the support platform. At this point, the sub-holes 3 are symmetrically formed and inclined with reference to the centerline of the air intake hole portion 1.

Each sub-hole 3 of the air intake hole portion 1 has a minimum diameter. Therefore, the flow rate of the air passing through the sub-holes 3 increases. Thus, even when a relatively small amount of air is introduced through the sub-holes 3, desired air pressure can be maintained due to the increased flow rate of the air. As a result, the desired air pressure can be realized using the relatively small amount of air, thereby reducing the process costs. In addition, since the sub-holes 3 are symmetrically formed and inclined with reference to the centerline of the support platform, the air can be uniformly distributed on the support platform.

An inventive platform having the above-described air intake hole portions will now be described.

Figure 3:
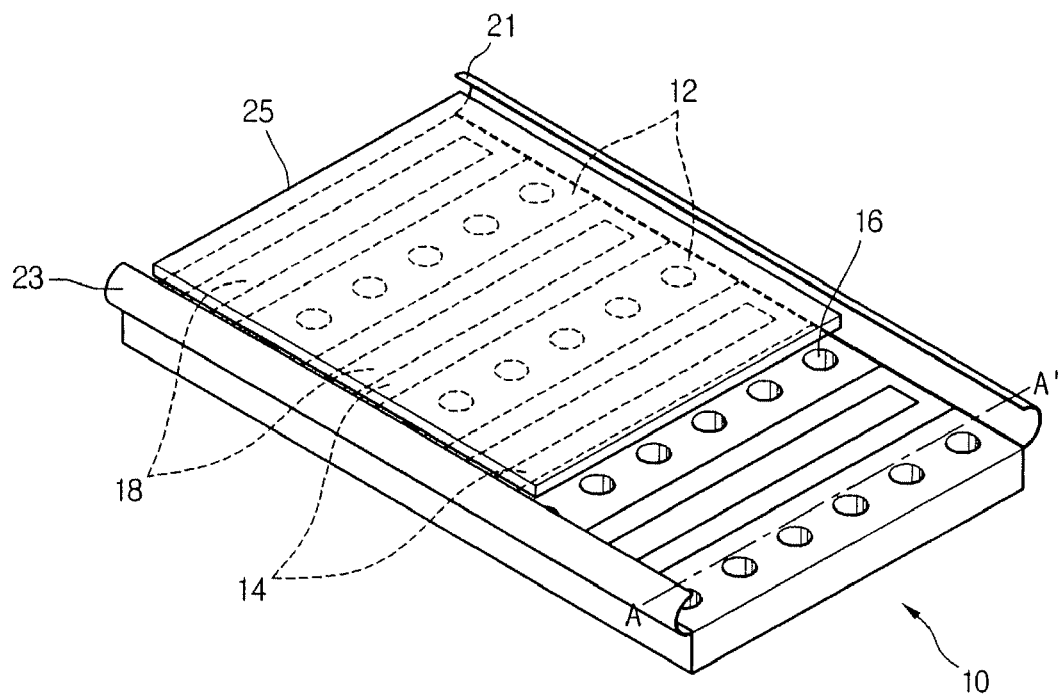
FIG. 3 is a schematic perspective view of a support platform of a non-contact transfer apparatus according to a first embodiment of the present invention.
Figure 4:
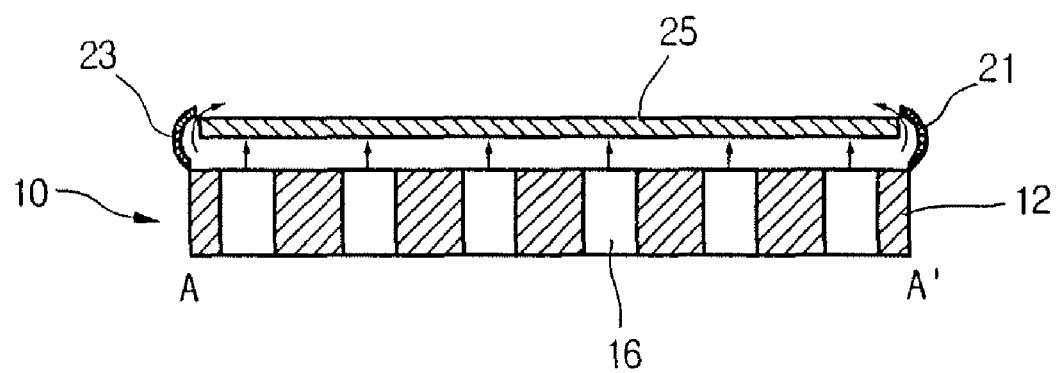
FIG. 4 is a sectional view taken along line A-A' of FIG. 3.

FIG. 3 is a schematic perspective view of a support platform of a non-contact transfer apparatus according to a first embodiment of the present invention and FIG. 4 is a sectional view taken along line A-A' of FIG. 3.

Referring to FIGS. 3 and 4, a support platform of this embodiment includes a plurality of air pads 12 and a plurality of dummy pads 14. The air pads 12 and the dummy pads 14 are alternately connected to each other and formed in a rectangular shape. The air and dummy pads 12 and 14 may be identical in a size to each other. In this embodiment, the air pads 12 may be connected to the dummy pads 14 by, for example screws or adhesive. The air and dummy pads 12 and 14 are arrayed in an alternating pattern with each other and form a guide pad 10.

A plurality of air intake hole portions 16 are formed in a line on each air pad 12. A plurality of sub-holes (3 of FIG. 2A) are formed through each air intake hole portion 16 and arranged in a substantially radial direction. Since the sub-holes are described with reference to FIGS. 2A and 2B, the detailed description thereof will be omitted herein.

A substantially rectangular slot 18 is formed on each dummy pad 14. Alternatively, in instead of the substantially rectangular slot 18, a plurality of air exhaust holes may be formed in a line on each dummy pad 14. However, the substantially rectangular slot 18 is more effective in exhausting the air.

First and second lift force guide members 21 and 23 are respectively attached or coupled on both sides of the guide pad 10. That is, the first and second lift force guide members 21 and 23 may be coupled to both sides of the air and dummy pads 12 and 14 by, for example, screws or adhesive. The first and second lift force guide member 21 and 23 may be formed in a substantially round shape that protrudes outward from both sides of the guide pad 10.

Generally, air pressure applied to a central portion of the object disposed on the support platform is greater than that applied to peripheral portions of the object. Therefore, the object may jolt while it is transferred. This becomes more severe for a large-sized object. That is, in the case of a large-sized object, the peripheral portions of the object may droop. This may cause damage to the object.

However, in this embodiment, since the first and second lift force guide members 21 and 23 are connected to both sides of the guide pad 10, the air introduced through the peripheral portions of the guide pad 10 flows along inner surfaces of the first and second lift force guide members 21 and 23. Therefore, a lift force is generated between the first and second lift guide members 21 and 23 and the peripheral portions of the object 25. By this lift force, the air pressure applied to the peripheral portions of the object 25 increases. Therefore, since the lift force is added to the relatively low air pressure at the peripheral portions of the object, the object can be stably transferred without jolting and drooping at the peripheral portions. In addition, since the sub-holes each having a minimized diameter are formed on the air intake hole portions, the air cushion may be formed by a relatively small amount of air, thereby reducing the consumption of the air.

Figure 5:
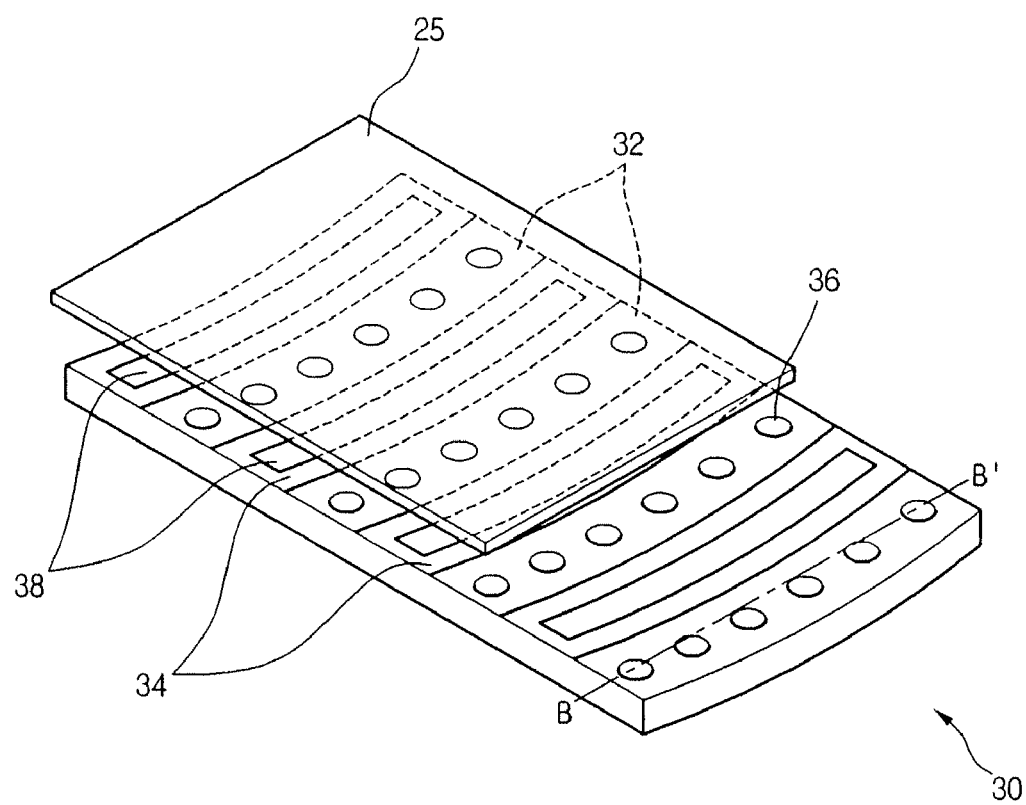
FIG. 5 is a schematic perspective view of a support platform of a non-contact transfer apparatus according to a second embodiment of the present invention.
Figure 6:
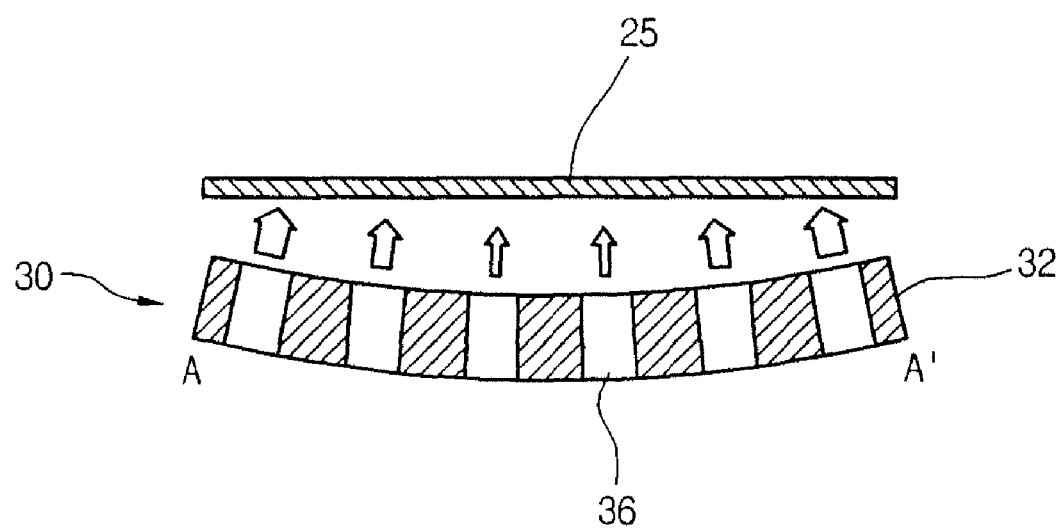
FIG. 6 is a sectional view taken along line B-B' of FIG. 5.

FIG. 5 is a schematic perspective view of a support platform of a non-contact transfer apparatus according to a second embodiment of the present invention and FIG. 6 is a sectional view taken along line B-B' of FIG. 5.

Referring to FIGS. 5 and 6, a support platform of this embodiment includes a plurality of air pads 32 and a plurality of dummy pads 34. The air pads 32 and the dummy pads 34 are alternately connected to each other and formed in a substantially rectangular shape. The air and dummy pads 32 and 34 may be identical in size to each other. In this embodiment, the air pads 32 may be connected to the dummy pads 34 by, for example, screws or adhesive. The air and dummy pads 32 and 34 respectively, are arranged in an alternating pattern with each other and form a guide pad 30.

A plurality of air intake hole portions 36 are formed in a line on each air pad 32 in a line. A plurality of sub-holes (3 of FIG. 2A) are formed through each air intake hole portion 36 and arranged in a substantially radial direction. Since the sub-holes are described with reference to FIGS. 2A and 2B, the detailed description thereof will be omitted herein.

A substantially rectangular slot 38 is formed on each dummy pad 34. Alternatively, in instead of the substantially rectangular slot 18, a plurality of air exhaust holes may be formed in a line on each dummy pad 34. However, the substantially rectangular slot 38 is more effective in exhausting the air.

The air and dummy pads 32 and 34, respectively, are substantially rounded and protrudes downward. A radius curvature of each pad may be optimized through a variety of simulations or tests in accordance with a size or weight of the object 25.

The object 25 is transferred in a state where it is lifted from the guide pad 30. At this point, since the guide pad 30 is rounded, a vertical distance between a central portion of the object and the guide pad 30 is less than those between peripheral portions of the object and the guide pad 30.

When it is assumed that the air is uniformly introduced through the air intake hole portions 36, the air pressure applied to the peripheral portions of the object 25 increases due to the short vertical distance between the peripheral portions while the air pressure applied to the central portion of the object 25 is reduced due to the long vertical distance between them. However, since the air pressure applied to the central portion of the object 25 is generally greater than that applied to the peripheral portion, the air pressure is uniformly applied to the overall surface of the object due to the rounded structure of the guide pad 30. As a result, the object can be stably transferred without jolting and drooping at the periphery portions.

Figure 7:
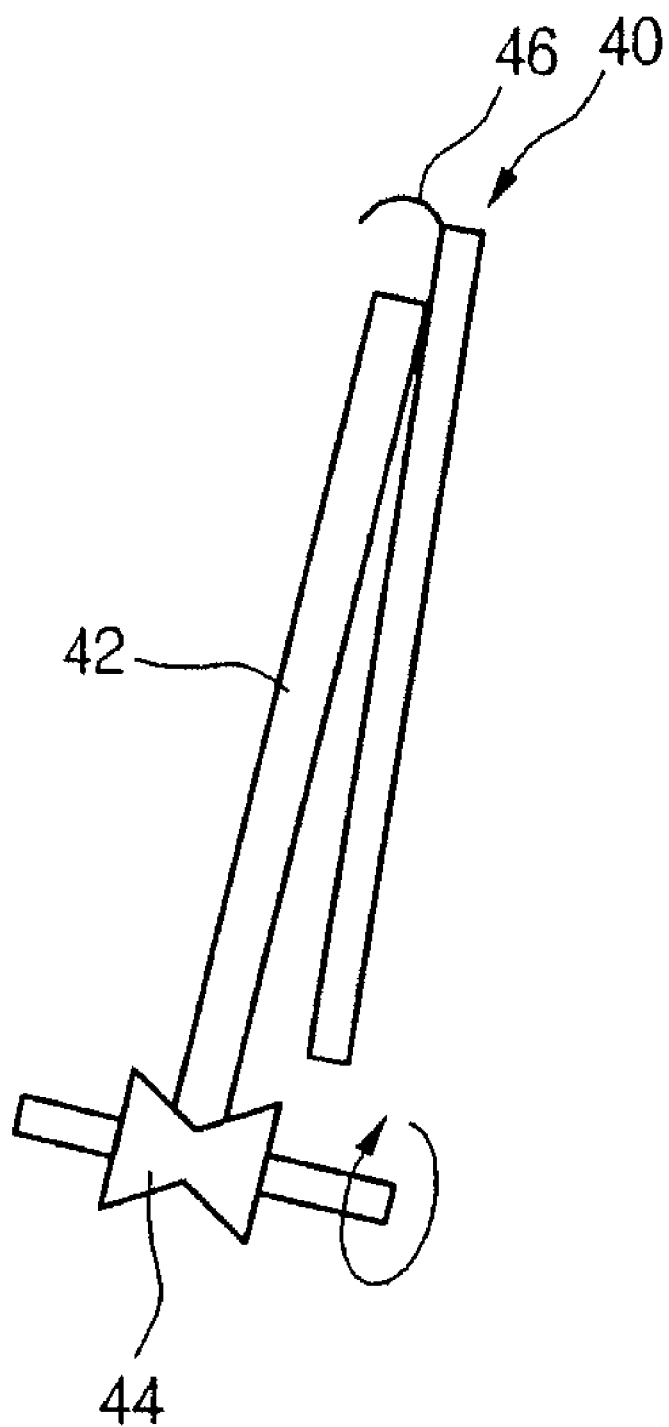
FIG. 7 is a schematic view of a transfer apparatus having a support platform according to a third embodiment of the present invention.

FIG. 7 is a schematic view of a transfer apparatus having a support platform according to a third embodiment of the present invention.

Referring to FIG. 7, a support platform 40 is installed at a predetermined inclination angle. The support platform 40 may be one of the first and second embodiments.

A transfer apparatus transfers an object 42 in a horizontal direction or in a vertical direction as shown in FIG. 7. When the support platform 40 is not operated, that is, when no air cushion is formed on the support platform 40, the object 42 leans on an upper portion of the support platform 40. However, when the support platform 40 is operated, the object 42 is pushed by the air cushion such that the object 42 can be transferred in a state where the object 42 is spaced apart from the support platform 40 by a predetermined interval.

A bottom of the object 42 seats on rollers. Therefore, the object 42 can be transferred in an advancing direction as the rollers 44 rotate. That is, when the object 42 is transferred by the rotation of the rollers 44, the air cushion is formed on the support platform 40 to transfer the object 42 in a state where the object 42 is lifted from the support platform.

A lift force guide member 46 is formed on an upper end of the support platform 40. The lift force guide member 46 is rounded upward. The lift force guide member 46 may be coupled to the upper end of the support platform 40 by, for example, screws or adhesive.

Therefore, when the air is introduced above the support platform 40, the air flows along the lift force guide member 46 to form a lift force near the lift force guide member 46, thereby allowing the object 42 to be effectively spaced apart from the support platform 40.

This lift force is added to the air pressure applied to an upper peripheral portion of the support platform 40. The air pressure generated at a central portion of the support platform 40 is generally higher than that generated at peripheral portions of the support platform 40. Therefore, when the lift force is added to the air pressure applied to the upper peripheral portion of the object 42, the uniform air pressure is applied to the central and peripheral portions of the object 42.

In the above-described embodiments, although the air pads and the dummy pads are arranged in an alternating pattern and connected and the air intake hole portions and the substantially rectangular slots are respectively formed on the air pads and the dummy pads, the present invention is not limited to this. That is, the support platform may include a single guide pad on which the air intake hole portions and the rectangular slots are formed along lines.

According to one exemplary embodiment of the present invention, since the lift force guide members are formed on both sides of the support platform to add the lift force to the air pressure applied to the peripheral portions of the object, the air pressure can be uniformly applied on the object.

According to another exemplary embodiment of the present invention, because the support platform is rounded downward, a vertical distance between the periphery portions of the support platform and the peripheral portions of the object can be shortened, thereby enhancing the air pressure applied to the peripheral portions of the object to stably transfer the object.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A support platform of a non-contact transfer apparatus, wherein the support platform is arranged horizontally has a substantially rounded shape that protrudes downward with respect to the support platform such that a relatively high air pressure can be applied to peripheral portions of a transferred object and a relatively low air pressure can be applied to a central portion of the transferred object,
    wherein the support platform includes a plurality of air intake hole portions formed along first lines,
    wherein each of the air intake hole portions includes a plurality of sub-holes,
    wherein the sub-holes formed along a centerline of the air intake hole portion are symmetrically inclined toward each other with reference to the center portion of the centerline.

2. The support platform according to claim 1, wherein a vertical distance between the object and the support platform is reduced from the center portion to the peripheral portions, and the air pressure applied to the object increases from the central portion to the peripheral portions of the object.

3. The support platform according to claim 1, further comprising a plurality of slots formed along the second lines on the support platform between the first lines.

4. The support platform according to claim 1, wherein the support platform includes a plurality of air pads and a plurality of dummy pads alternately arranged and connected with the air pads, a plurality of air intake hole portions formed on each of the air pads, and one or more slots formed on each of the dummy pads.

5. The support platform according to claim 4, wherein the plurality of sub-holes are arranged in a radial direction.

* * * * *